United States Patent
Yamamoto

(10) Patent No.: US 8,071,278 B1
(45) Date of Patent: Dec. 6, 2011

(54) MULTIPLE PATTERNING TECHNIQUE USING A SINGLE RETICLE

(75) Inventor: Yasuhisa Yamamoto, Yokohama (JP)

(73) Assignee: Cadence Design Systems, Inc., San Jose, CA (US)

( * ) Notice: Subject to any disclaimer, the term of this patent is extended or adjusted under 35 U.S.C. 154(b) by 385 days.

(21) Appl. No.: 11/787,619

(22) Filed: Apr. 16, 2007

(51) Int. Cl.
  *G03C 5/00* (2006.01)
  *H01L 21/00* (2006.01)
  *G03F 1/00* (2006.01)
(52) U.S. Cl. .............. 430/394; 430/5; 430/311; 430/312
(58) Field of Classification Search .............. 430/5, 311, 430/312, 394
See application file for complete search history.

(56) References Cited

U.S. PATENT DOCUMENTS

| | | | |
|---|---|---|---|
| 4,849,313 A * | 7/1989 | Chapman et al. | 430/5 |
| 6,436,589 B1 | 8/2002 | Smith | |
| 6,861,180 B2 | 3/2005 | Chang | |
| 2004/0209193 A1 * | 10/2004 | Pierrat et al. | 430/311 |
| 2006/0216649 A1 * | 9/2006 | Paxton et al. | 430/311 |
| 2007/0054198 A1 * | 3/2007 | Park | 430/5 |
| 2008/0032203 A1 * | 2/2008 | Phillipps et al. | 430/5 |

OTHER PUBLICATIONS

Hand, Aaron, "Double Patterning Wrings More From Immersion Lithography", Reed Business Information, retrieved from website: <http://www.semiconductor.net/article/CA6409507.html>, dated Feb. 1, 2007, 5 pages.

* cited by examiner

*Primary Examiner* — Stephen Rosasco
*Assistant Examiner* — Jonathan Jelsma
(74) *Attorney, Agent, or Firm* — Holland & Knight LLP; Brian J. Colandreo, Esq.; Mark H. Whittenberger, Esq.

(57) ABSTRACT

Double patterning using a single reticle. A blading technique may be used to allow a single reticle to be used for double patterning. The reticle is placed into a lithographic apparatus and a first portion of the pattern is exposed onto a first photoresist overlaying a target region, while blading the second portion of the pattern. Then, a second portion of the pattern is exposed onto a second photoresist, while blading the first portion. Alternatively, each portion of the pattern may be exposed to the photoresist simultaneously, but to different target regions. Then shot coordinates are adjusted and the portions are exposed to a photoresist again to allow creation of the composite pattern in at least one of the target regions. During the double patterning process, the reticle may be kept in the lithographic apparatus.

22 Claims, 13 Drawing Sheets

MULTIPLE PATTERNING TECHNIQUE USING A SINGLE RETICLE

FIELD OF THE INVENTION

The present invention relates generally to semiconductor fabrication and, more specifically, to a double (or more) patterning lithography technique that uses a single reticle having two or more portions of a pattern.

BACKGROUND

As lithography process technology moves to smaller and more closely spaced features, it becomes more difficult to print the original design onto a wafer due to resolution limits. A primary limitation is how closely features can be spaced due to optical limitations. This is so even if resolution enhancement techniques (RET) such as optical proximity correction (OPC), immersion scanning, and phase shift masks are employed.

Double patterning is a technique that has been considered to achieve more closely spaced features. In double patterning, two reticles are used to print split portions of an original pattern onto a hard mask that, in turn, is used to transfer the original pattern to the substrate. To print two patterns on the hard mask, the original pattern is split into two or more patterns where each has a narrowest pitch that is wider than the narrowest pitch in the original pattern. Each of the split patterns is printed to a separate reticle. First one reticle is exposed onto a photoresist above the hard mask. After transferring the first pattern from the photomask to the hard mask, the photomask is removed, and another photomask is added above the hard mask. Next, the second reticle is exposed onto the second photoresist. After transferring the second pattern to the hard mask, the second photomask is removed. Finally, the combined pattern is transferred from the hard mask to the wafer.

However, for such a technique to be effective the exposure of the two split patterns needs to be precisely aligned such that the original pattern is achieved. However, lithography techniques have limitations in how precisely the two patterns can be aligned.

Thus, improved techniques for forming devices, such as semiconductors, having narrow pitches are desired.

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

BRIEF DESCRIPTION OF THE DRAWINGS

The present invention is illustrated by way of example, and not by way of limitation, in the figures of the accompanying drawings, in which like reference numerals refer to similar elements, and in which.

DETAILED DESCRIPTION OF EMBODIMENTS OF THE INVENTION

Figure 1:
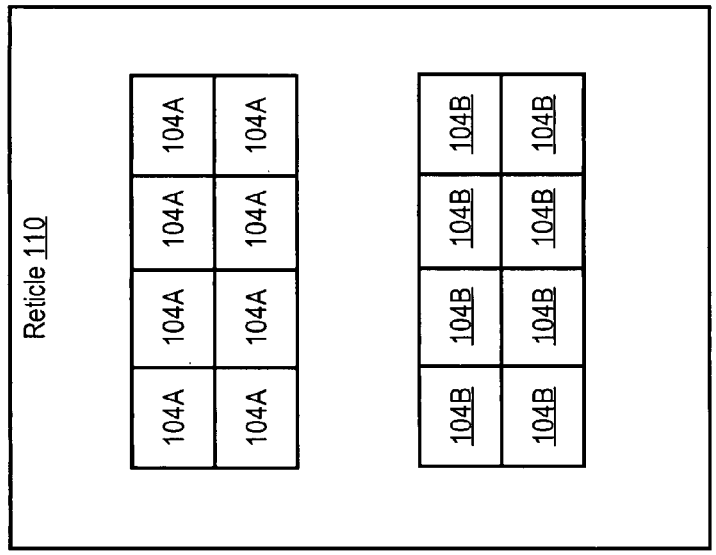
FIG. 1 illustrates a simplified original pattern split into two portions, which are incorporated into a single reticle, according to an embodiment of the invention.
Figure 1:
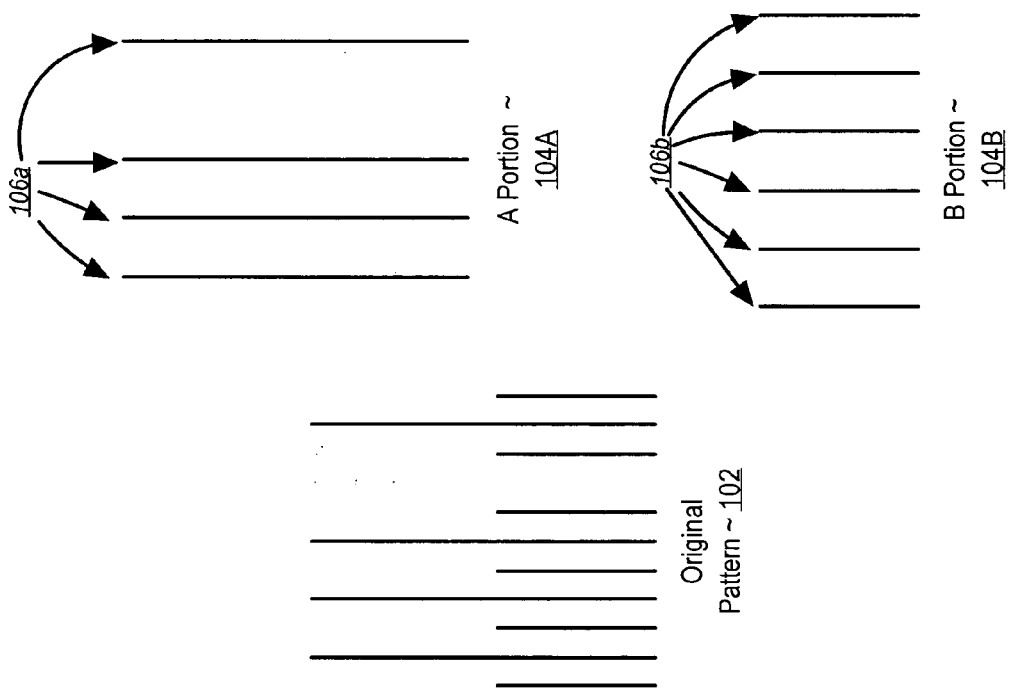

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Overview

Mechanisms are disclosed herein for double patterning using a single reticle. An original pattern of a design to be patterned in a target material is split into two portions, each with a narrowest pitch that is wider than the narrowest pitch of the original pattern. Splitting the pattern results in separating features that were interleaved in the original pattern. The two portions are then printed onto a single reticle. However, because the features that were interleaved in the original pattern have been separated, the narrowest pitch in the individual portions has been increased. If desired, OPC can be applied to each portion.

A blading technique is used to allow a single reticle to be used for double patterning, in accordance with an embodiment. The reticle is placed into a lithographic apparatus and the first portion of the pattern is exposed onto a first photoresist overlaying a target region of a material to be patterned, while blading the second portion of the pattern. Blading the second portion prevents that portion from being exposed onto the first photoresist. The first photoresist is then developed, and the pattern is transferred from the first photoresist to the target region. As an example, the material that forms the target region is a hard mask below the photoresist, wherein transferring the pattern is achieved by etching the hard mask. Then, the first photoresist is stripped and a second photoresist is spun on over the target region. Then, the second portion of the pattern is exposed onto the second photoresist, while blading the first portion. The second photoresist is then developed, the second portion of the pattern is transferred to the target region of the material, and the second photoresist is stripped. Thus, the composite pattern has now been transferred to the target region (e.g., hard mask) with features of the first portion and second portion interleaved. Then, the pattern may be transferred from the target region to another region. For example, the composite pattern can then be transferred from the hard mask to a wafer. Note that because a single reticle is used, mask-to-mask overlay errors are reduced or eliminated. Further, during the double patterning process using blading, the reticle may be kept in the lithographic apparatus, although the wafer may be removed.

In another embodiment, double patterning is achieved with a single reticle without blading. Rather, each portion of the pattern is exposed to the photoresist at the same time, but the portions are exposed to different target regions. For example, the first portion is exposed to a first photoresist above a first target region of a material to be patterned at the same time that the second portion is exposed to the first photoresist which also covers a second target region of a material to be patterned. The target region can be a hard mask below the photoresist. The first and second target regions could be regions that will become different integrated circuits (chips), but this is not a requirement. Then, the first photoresist is developed, the first portion of the pattern is transferred from the first photoresist to the first target region, and the first photoresist is removed. Then, a second photoresist is spun on over the target regions. Next, the first portion of the pattern is exposed to the second photoresist above the second target region at the same time that the second portion is exposed to the second photoresist over another target region (this could be a third target region). The second portion may be exposed to the first target region later. The second photoresist is then developed, the hard mask is etched, and the second photoresist is stripped. Thus, the pattern has now been transferred to the hard mask with features of the first portion and second portion interleaved in each target region. Finally, the pattern of each target region is transferred from the hard mask to the wafer. Again, because a single reticle is used, mask-to-mask overlay errors are reduced or eliminated. Further, during double patterning by simultaneously exposing each portion of the pattern to a different target region, the reticle may be kept in the lithographic apparatus, although the wafer may be removed.

The foregoing embodiments describe double patterning using a double exposure-double etch technique in which each portion of the pattern is exposed to a different photoresist. Double patterning may also be achieved by double exposure-single etch. In double exposure-single etch embodiments, a single photoresist is used instead of the first and second photoresist. In these embodiments, the second portion of the pattern is exposed on the single photoresist prior to etching the target region and removing the photoresist. Thus, the single photoresist has the pattern with the interleaved features of the first portion and second portion. Then, the pattern may be transferred from the photoresist to the target region.

Example Split Pattern and Reticle in Accordance with an Embodiment

FIG. 1 illustrates a simplified original pattern 102, which has features 106a and features 106b. The pattern 102 represents a design that is to be formed in, for example, a wafer. The original pattern 102 is split into an "A" portion 104A and a "B" portion 104B such that features 106a form the A portion 104A and features 106b form the B portion 104B. Separating features 106a from features 106b results in the narrowest pitch in each of the A portion 104A and the B portion 104B being larger than the narrowest pitch in the original pattern 102.

The features 106a and 106b are interleaved in the original pattern 102. By interleaved it is meant that for at least some pairs of adjacent features 106b, there is at least one feature 106a therebetween. Therefore, removing the feature 106a increases the width of the pitch between the pair of adjacent features 106b in the B portion 104B relative to the pitch between the adjacent features of 106a and 106b in the original pattern 102. It is not required that all pairs of adjacent features 106b in the original pattern 102 have a feature 106a therebetween. Likewise, at least some pairs of adjacent features 106a in the original pattern 102 may have a feature 106b therebetween. However, it is not required that all pairs of adjacent features 106a in the original pattern 102 have a feature 106b therebetween.

A reticle 110 in accordance with an embodiment of the present invention has at least one instance of the A portion 104A and at least one instance of the B portion 104B. The example reticle 110 has eight instances of the A portion 104A and eight instances of the B portion 104B. Having eight instances allows processing of eight chips on a wafer with a single exposure of the reticle 110 to a photoresist.

The A portions 104A are separated from the B portions 104B such that the B portions 104B can be bladed while the A portions 104A are exposed to a photoresist, in an embodiment. Likewise, the A portions 104A can be bladed while the B portions 104B are exposed to a photoresist, as described with reference to FIG. 2.

Example Lithographic System

Figure 11:
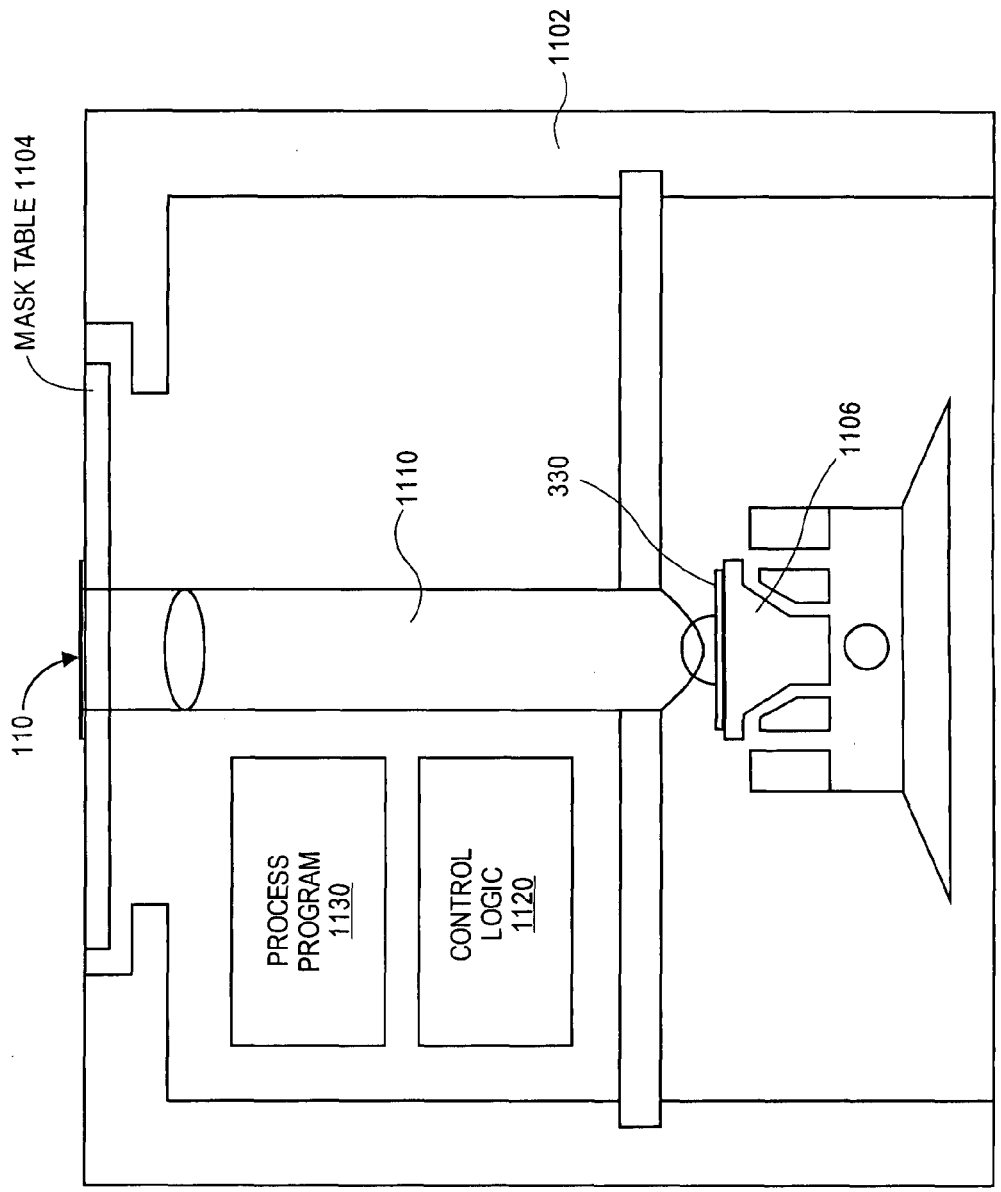
FIG. 11 is an example lithographic system, in accordance with an embodiment of the present invention.

FIG. 11 is an example lithographic system 1100, in accordance with an embodiment of the present invention. The lithographic system 1100 includes a lithographic apparatus 1102 having a mask table 1104, a wafer table 1106, a projection system 1110, and control logic 1120. The system 1100 includes a reticle 110 positioned on the mask table 1104 and a wafer 330 positioned on the wafer table 1106. The wafer 330 includes a material to be patterned by the reticle 110. The projection system 1110 is used to expose at least a portion of the reticle 110 onto one or more target regions of the wafer 330.

In one embodiment, the lithographic apparatus 1102 is capable of being operated in a stepper mode in which whatever portion of the pattern is to be exposed to the wafer 330 is exposed in a single step. In another embodiment, the lithographic apparatus 1102 is capable of being operated in a scanning mode in which whatever portion of the pattern is to be exposed to the wafer 330 is exposed by progressive scanning. In progressive scanning the mask table 1104 and the wafer table 1106 are moved in opposite directions, in an embodiment.

The process program 1130 stores instructions for processing the wafer 110. The control logic 1120 reads the process program 1130 and controls exposure of appropriate portions of the reticle 110 onto appropriate target regions of the wafer 330 to achieve double patterning.

Process Flow Using Blading in Accordance with an Embodiment

Figure 2:
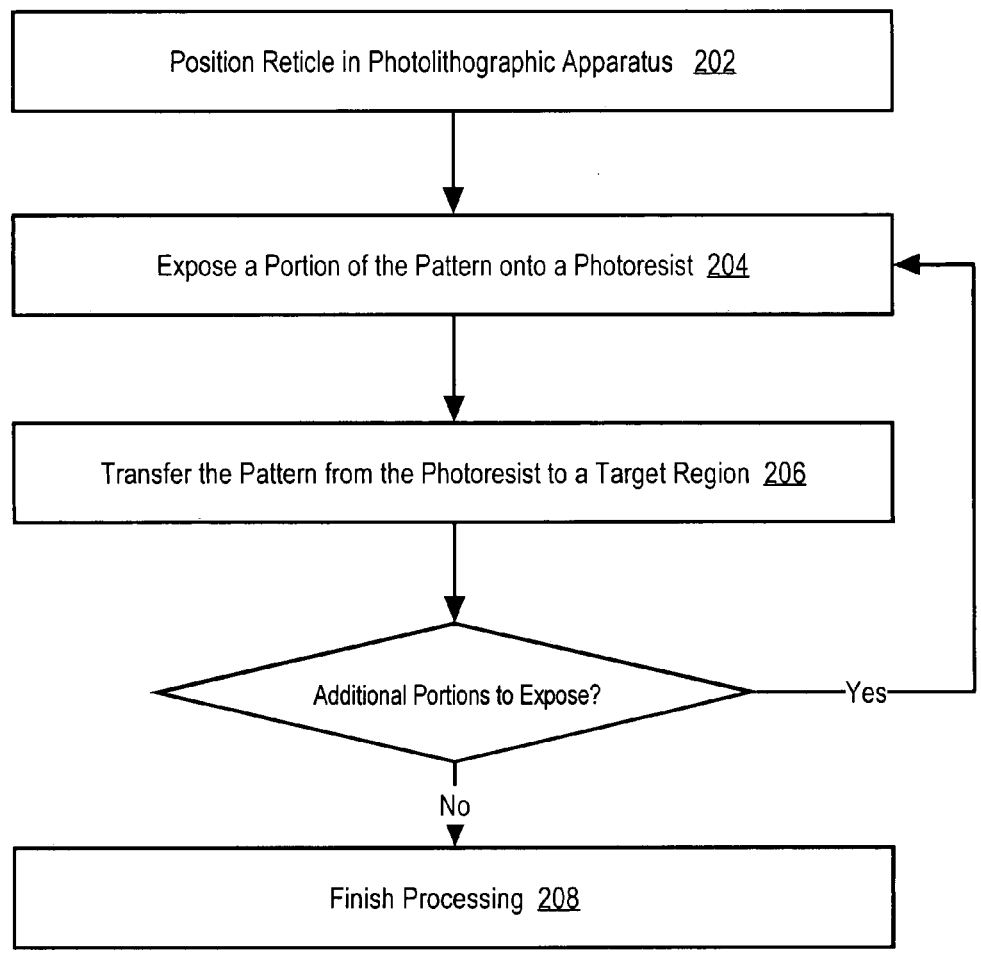
FIG. 2 is flowchart illustrating a process of double patterning using a single reticle, in accordance with an embodiment of the present invention.

FIG. 2 is flowchart illustrating a process 200 of double patterning using a single reticle, in accordance with an embodiment of the present invention. FIG. 3A-3C and FIG. 4A-4C, which depict a cross-sectional view of formation of the pattern 102 in a target region, will be discussed with the flow of process 200. However, process 200 is not limited to the examples in those Figures. In block 202, the reticle 110 is placed into a lithographic apparatus. For example, the reticle 110 is placed on a mask table in the lithographic apparatus.

Figure 3A:
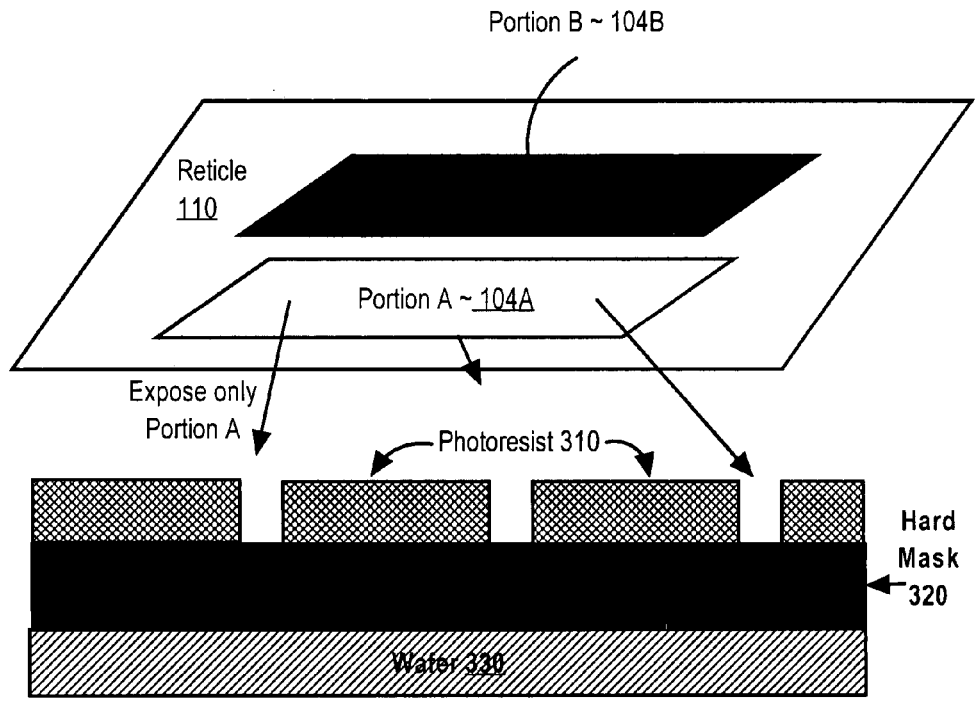
FIGS. 3A, 3B, and 3C depict cross-sectional views of formation of a first portion of a pattern in a target region using a single reticle, in accordance with an embodiment of the present invention.

In block 204, a portion of the pattern 102 is exposed onto a photoresist. For example, referring to FIG. 3A, the A portion 104A is exposed onto the photoresist 310. While the A portion 104A is exposed onto the photoresist, the B portion 104B is bladed such that it is prevented from being exposed to any portion of the photoresist 310, in an embodiment. FIG. 3A depicts the photoresist 310 after it has been developed. At this stage, the photoresist 310 has the A portion 104A of the pattern formed therein.

Figure 3B:
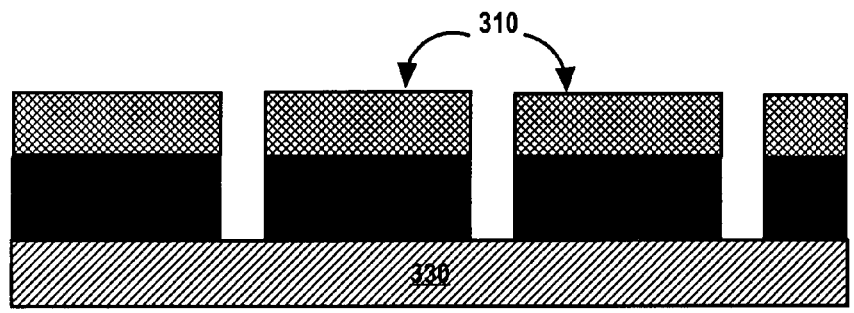
Figure 3C:
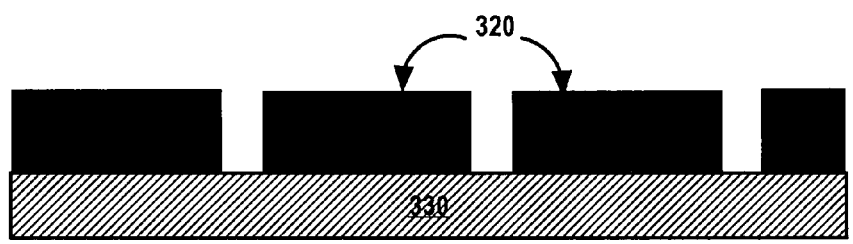

In block 206, the A portion 104A of the pattern is transferred from the photoresist 310 to the target region of the material to be patterned. Referring to FIG. 3B, the hard mask 320 is etched to transfer the A portion 104A of the pattern to the hard mask 320. Then, the photoresist 310 is stripped, as depicted in FIG. 3C. During block 206, the wafer may be removed from the lithographic apparatus for processing; however, the reticle 110 may stay in place in the lithographic apparatus.

Figure 4A:
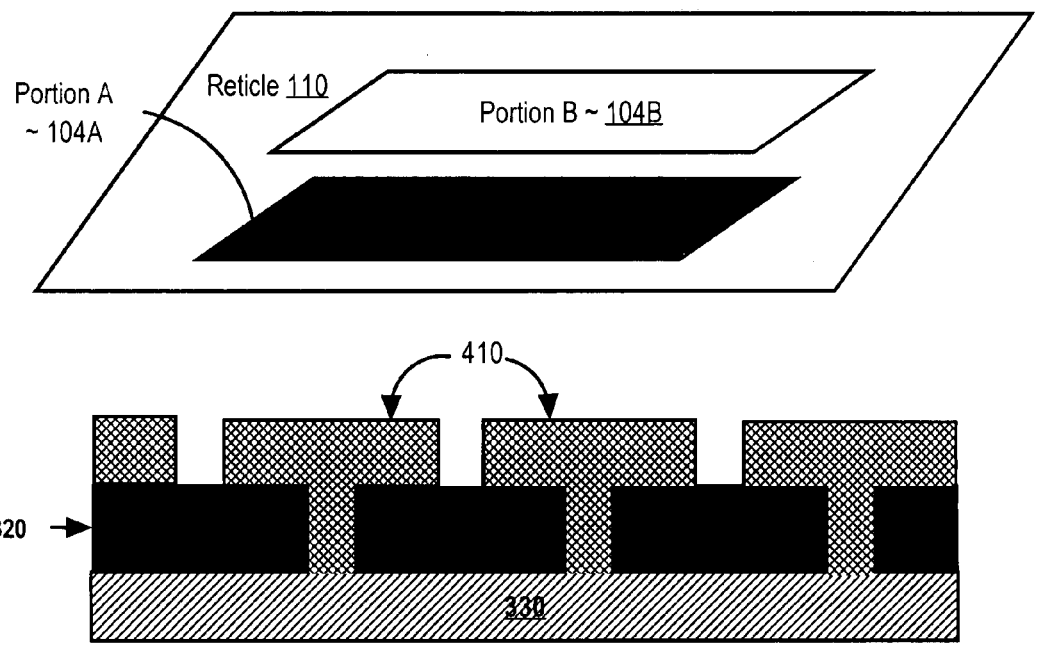
FIGS. 4A, 4B, and 4C depict cross-sectional views of formation of a complete pattern in a target region using a single reticle, in accordance with an embodiment of the present invention.

If there are additional portions of the pattern to transfer to the target region, then the process 200 returns to block 204 to expose the next portion of the pattern. Referring to FIG. 4A, after spinning on a new photoresist 410, the B portion 104B of the pattern is exposed onto the photoresist 410. While the B portion 104B is exposed, the A portion 104A is bladed to prevent it from being exposed to any portion of the photoresist 410, in an embodiment. FIG. 4A depicts the photoresist 410 after it has been developed such that the B portion 104B of the pattern has been transferred to the photoresist 410. Note that the reticle 110 may be kept in place on the mask table throughout process 200. That is, the reticle 110 is not removed from the mask table between the time that the A portion 104A and the B portion 104B are exposed to the photoresists 310, 410, in an embodiment.

Figure 4B:
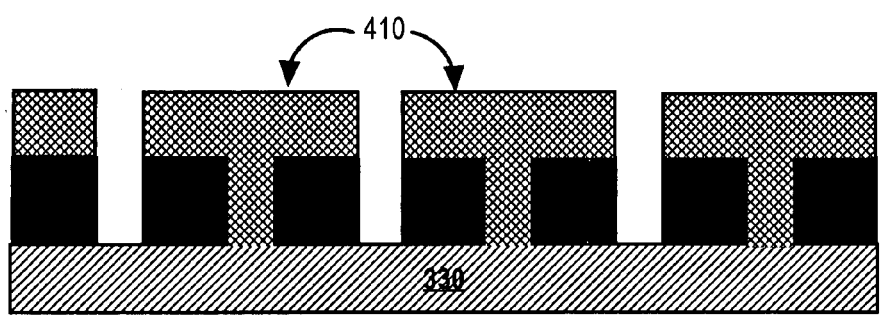
Figure 4C:
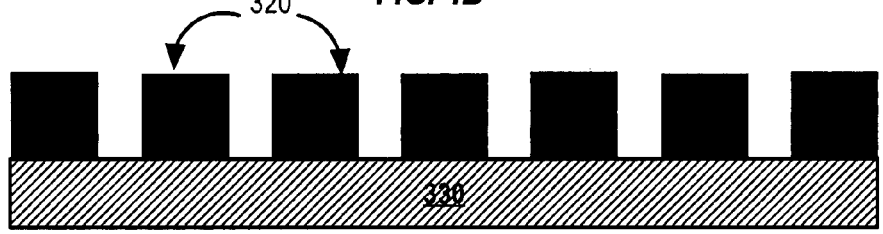

In block 206, the B portion 104B of the pattern is transferred from the photoresist 410 to the target region. Referring to FIG. 4B, the hard mask 320 is etched to transfer the B portion 104B of the pattern to the hard mask 320. Then, the photoresist 410 is stripped, as depicted in FIG. 4C. Therefore, the hard mask 310 has the combined pattern 102 with the features of the A portion 104A and the features of the B portion 104B interleaved.

In block 208, further processing is performed. For example, the combined pattern 102 is transferred from the hard mask 320 to the wafer 330.

Example Reticle in Accordance with an Embodiment

Figure 5:
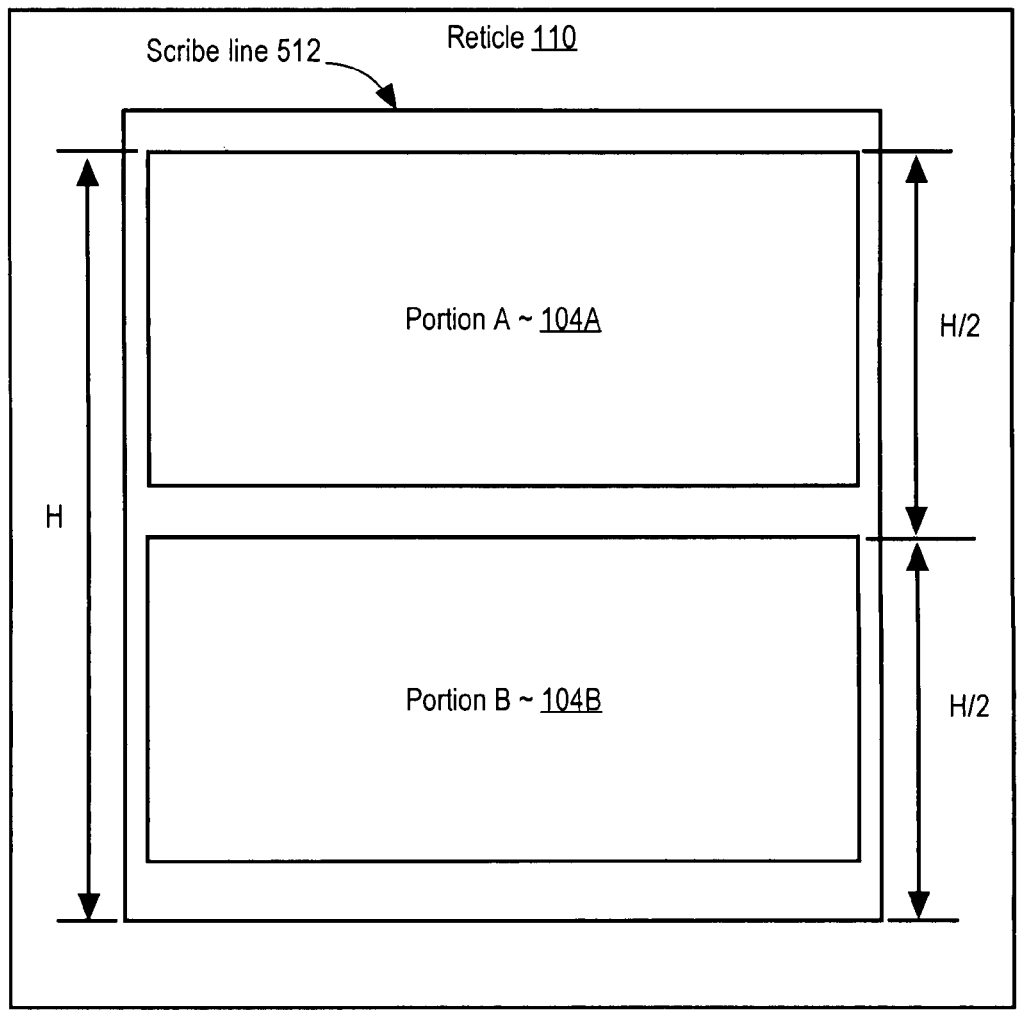
FIG. 5 depicts an example reticle in accordance with an embodiment of the present invention.

In accordance with another embodiment, the portions of the pattern 102 are configured on the reticle 110 such that all portions can be simultaneously exposed to a photoresist. However, the portions are exposed to different target regions. Later the shot coordinates that expose the reticle 110 are changed to result in double patterning, as described below with reference to FIG. 6. FIG. 5 depicts an example reticle 110 in accordance with such an embodiment of the present invention. In the embodiment of FIG. 5, the A portion 104A and the B portion 104B are both within the same scribe line 512. Thus, both the A portion 104A and the B portion 104B can be substantially simultaneously exposed to a photoresist. Of course, while two portions are depicted, the reticle 110 is not limited to having only two portions in that the pattern 102 could be split into three or more portions. Therefore, three or more portions could be substantially simultaneously exposed to different target regions when using the reticle 110.

Figure 6:
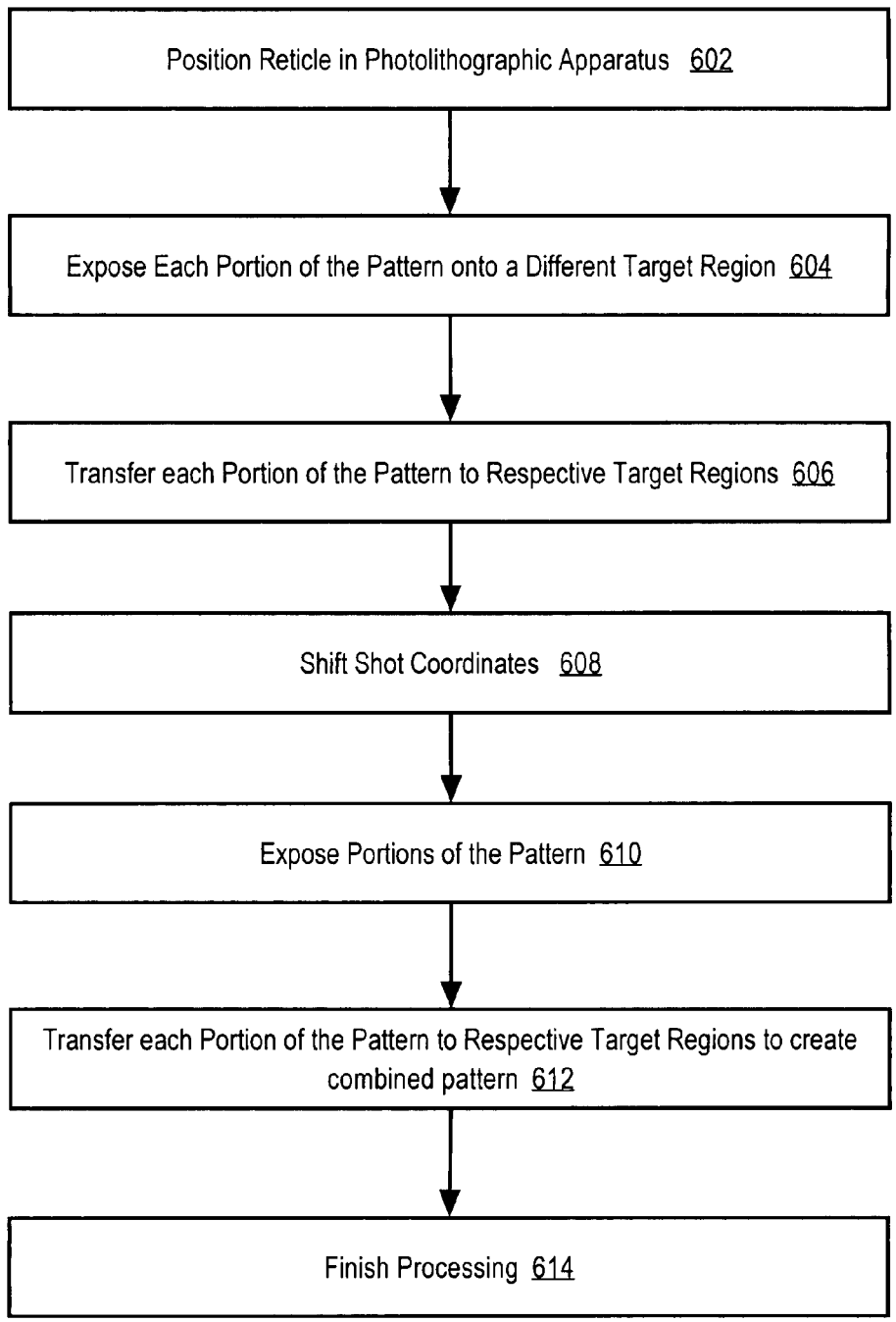
FIG. 6 is flowchart illustrating an overview of a process of double patterning using a single reticle, in accordance with an embodiment of the present invention.
Figure 7A:
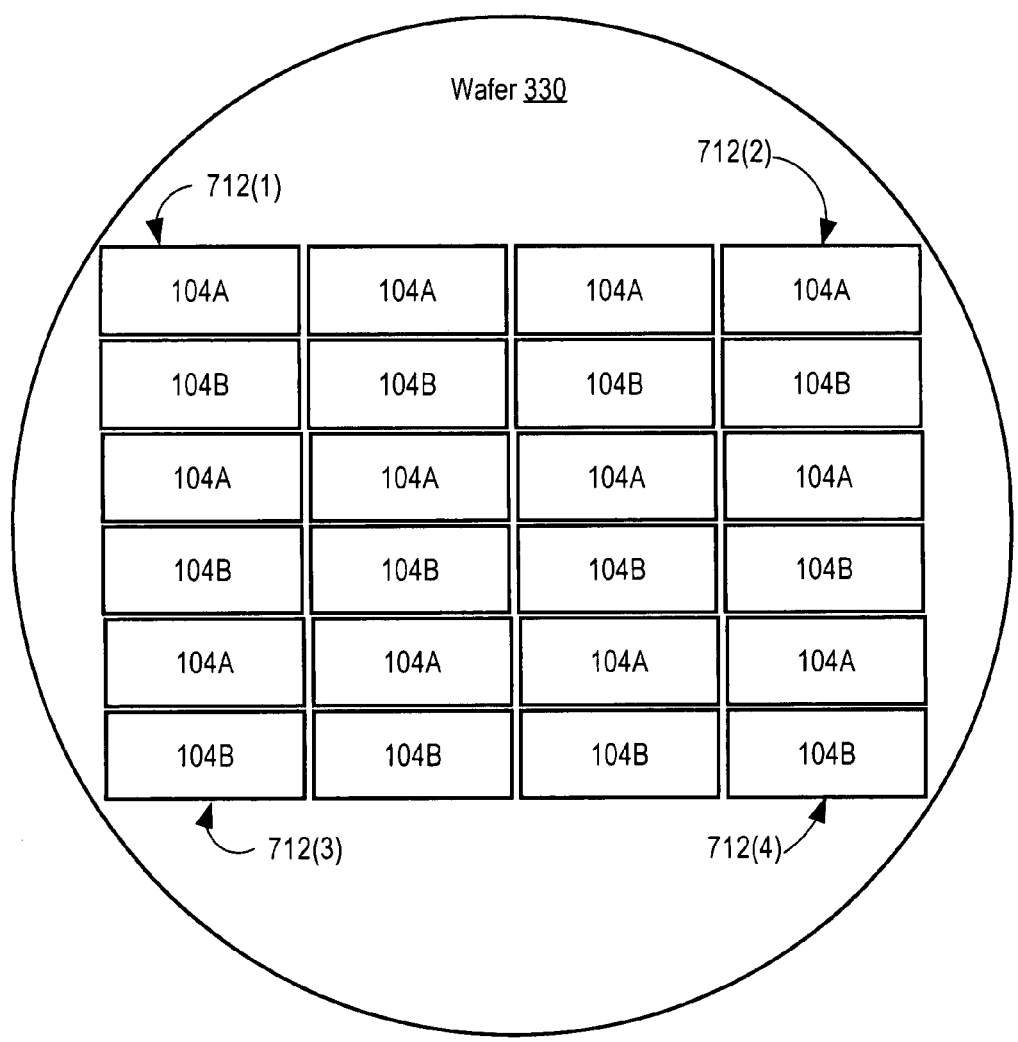
FIGS. 7A, 7B, and 7C are block diagrams depicting a number of chips being formed wafer, in accordance with an embodiment.
Figure 7B:
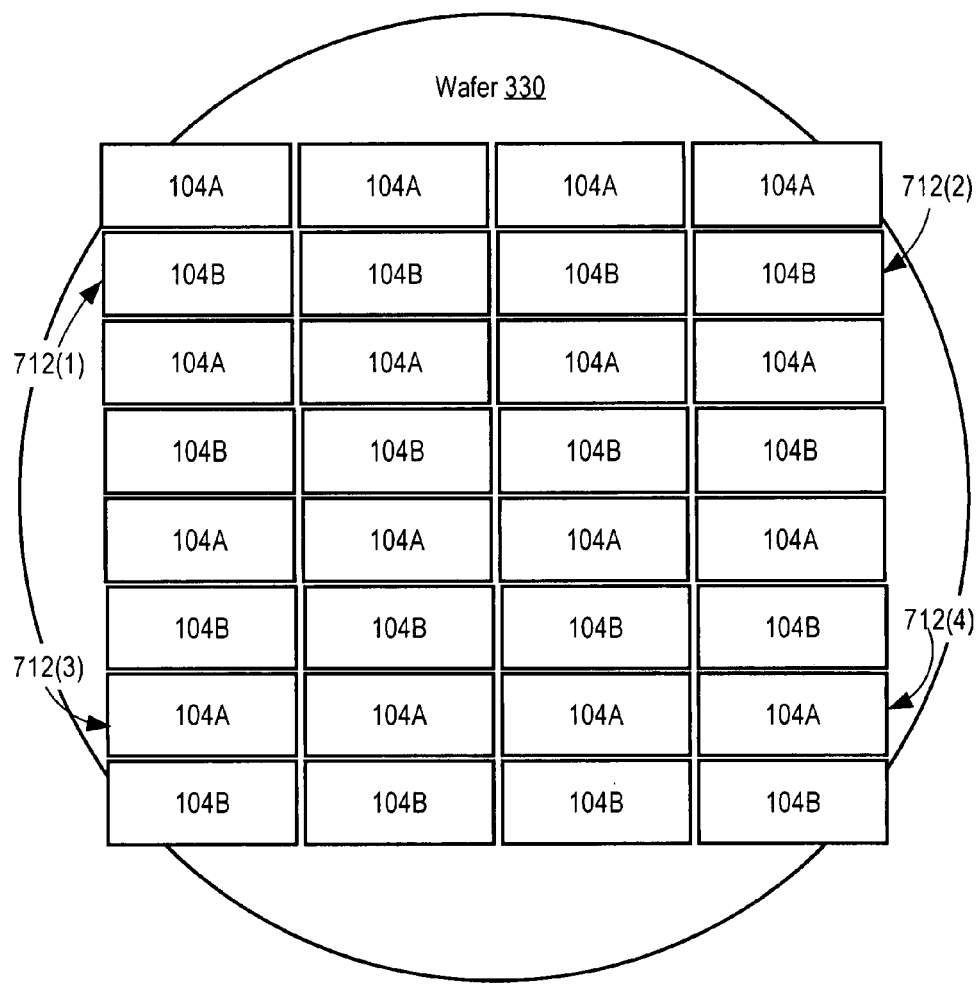
Figure 7C:
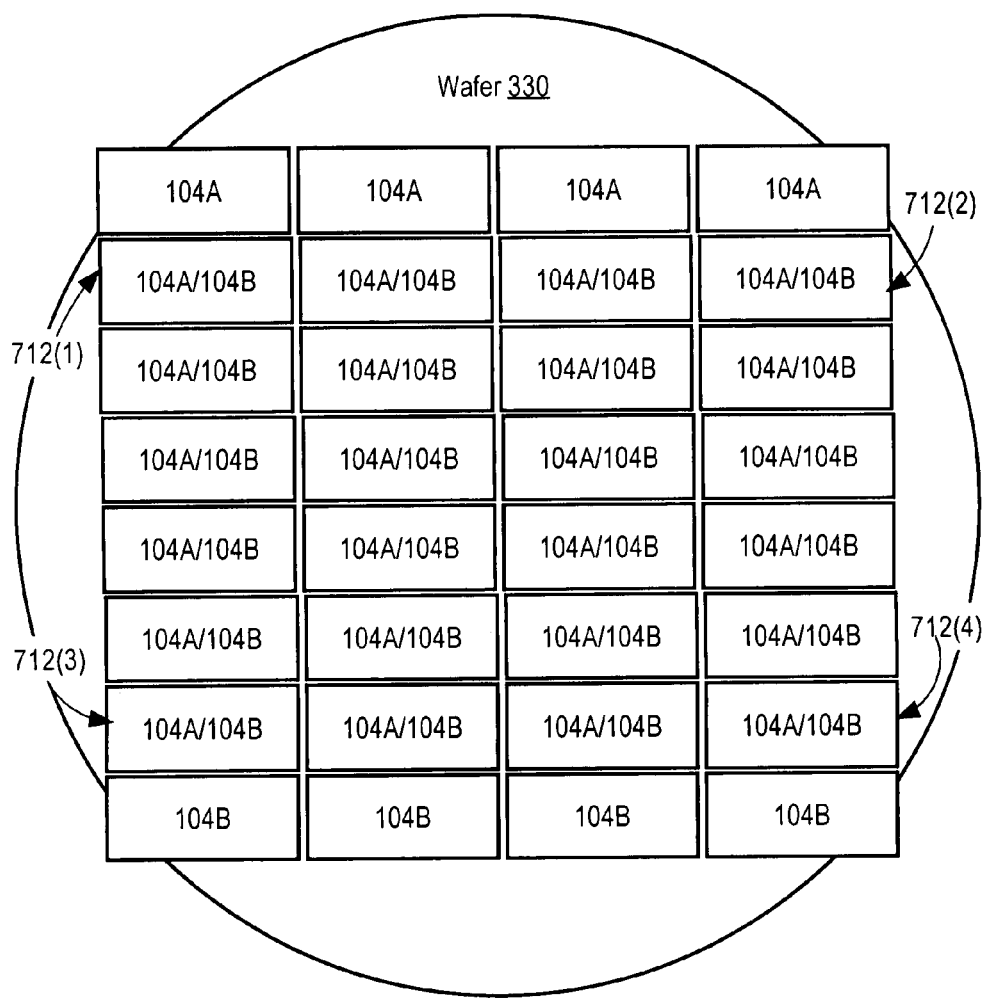

Process Flow Having Simultaneous Exposure of Multiple Portions In Accordance with an Embodiment FIG. 6 is flowchart illustrating an overview of a process 600 of double patterning using a single reticle 110, in accordance with an embodiment of the present invention. In this embodiment, each portion of the pattern is simultaneously exposed to a different target region to be patterned. The example reticle 110 depicted FIG. 5 will be used to explain process 600. However, process 600 is not limited to this example reticle 110. FIGS. 7A, 7B, and 7C, which are block diagrams depicting a number of chips 712 being formed on a wafer 330 in accordance with an embodiment, will also be used to explain process 600. In block 602, the reticle 110 is placed into a lithographic apparatus.

In block 604, each portion of the pattern is exposed onto a photoresist, but to different target regions. Exposing each portion can be achieved with a single "shot". However, multiple shots can be made with a stepper or a scanner to expose the portions to additional target regions of the wafer 330. Each target region is used to form a separate chip, in one embodiment. For example, referring to FIG. 7A, 12 shots are made on the wafer 330, with each shot exposing one instance of the A portion 104A and one instance of the B portion 104B to the photoresist.

Note that exposing at least one instance of an A portion 104A and at least one instance of a B portion 104B, which are part of a single reticle 110, with a single shot allows for better shot throughput than if the A portion 104A and the B portion 104B were exposed separately. Further note that a reticle 110 may have multiple instances of each A portion 104A and each B portion 104B, each of which are exposed using a single shot.

Individual reference numerals have been provided for several of the chips 712(1)-712(4) to facilitate comparison with FIGS. 7B and 7C. Each instance of the A portion 104A overlays a target region. Each instance of the B portion 104B overlays a different target region. When shifting shot coordinates to a new row on the wafer 330, the shot coordinates are shifted by "H" units (see FIG. 5).

In block 606, each portion of the pattern is transferred from the photoresist to one of the target regions of the material to be patterned. For example, a hard mask is etched to transfer the pattern of each A portion 104A and each B portion 104B to different target regions of a hard mask. Then, the photoresist 310 is stripped and a new photoresist is spun on the wafer 330.

In block 608, shot coordinates are shifted to allow for the A portion 104A of the pattern to be exposed in the target regions where the B portion 104B was exposed in block 604. Likewise, the B portion 104B is aligned to be exposed where the A portion 104A was exposed in block 604. Such an adjustment can be achieved by moving shot coordinates upward by H/2 units.

In block 610, each portion of the pattern is exposed onto the newly spun on photoresist. This time the stepper or scanner is set to make 16 shots on the wafer, in this example. FIG. 7B depicts the locations of those 16 shots, with each shot comprising one instance of an A portion 104A and one instance of a B portion 104B. FIG. 7C depicts the combined results depicting that in rows 2-7 there are 24 chips 712, with each chip 712 containing the features of the A portion 104A interleaved with the features of the B portion 104B to result in the combined pattern.

In block 610, the pattern 102 is transferred from the photoresist to the target regions (e.g., hard mask). Then, the photoresist is stripped away. Referring to FIG. 7C, there are four target regions in the top row of the wafer 330 that have only been exposed to the A portion 104A, and another four target regions in the bottom row that have only been exposed to the B portion 104B. These target regions will not be used, in an embodiment. However, the target regions in these rows that fully reside within the wafer 330 can be appropriately exposed to the other portion of the pattern 102 to allow the combined pattern 102 to be formed, if desired.

In block 612, further processing is performed. For example, the pattern 102 is transferred from the hard mask to the wafer 330. Note that the reticle 110 may be kept in place on the mask table throughout process 600.

Example Array Patterns

Figure 8A:
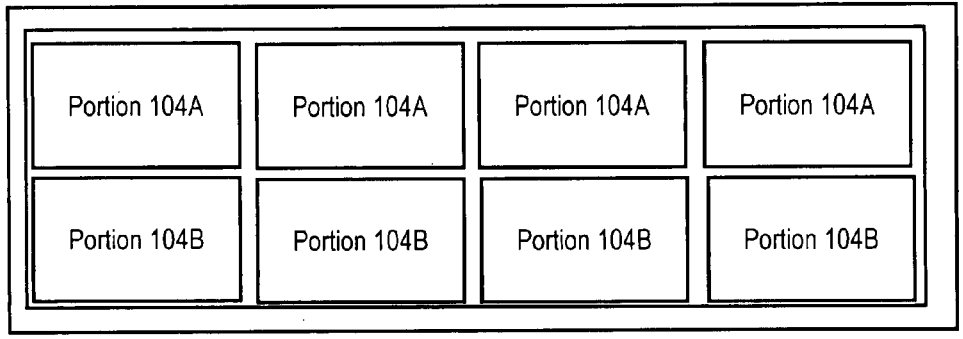
FIGS. 8A, 8B, and 8C depict variations for double patterning using a single reticle, in accordance with several embodiments.
Figure 8B:
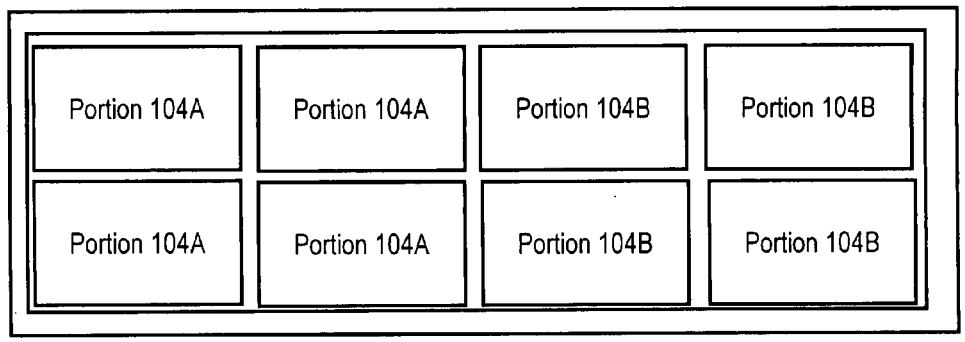
Figure 8C:
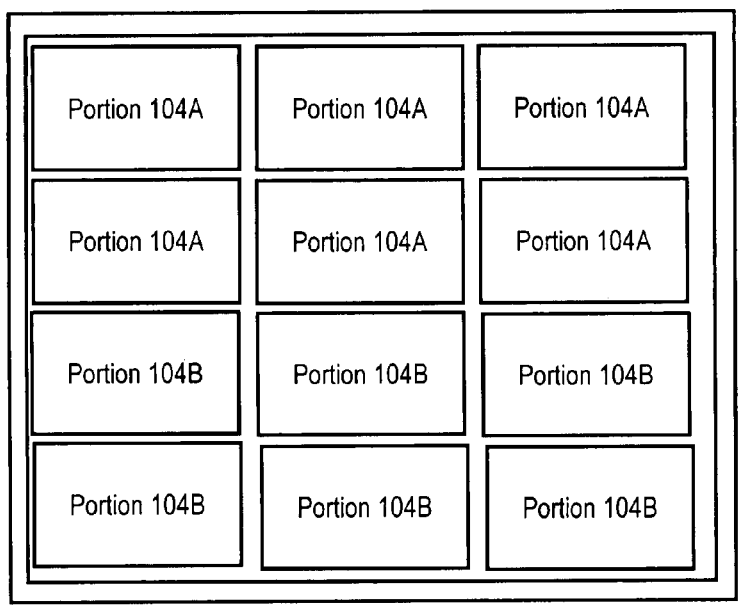

Process 600 can be performed using a reticle 110 other than the one depicted in FIG. 5. FIG. 8A-8C depict a few variations for double patterning using a single reticle 110, in accordance with several embodiments. In these examples, the reticle 110 includes an array of the A portions 104A and the B portions 104B. FIG. 8A depicts a 4×2 array configuration with each A portion 104A on the top row and each B portion 104B on the bottom row. Using a configuration, such as an array, that has more than one instance of each particular portion, improves shot throughput relative to configurations having only a single instance of each portion. For example, in the embodiment depicted in FIG. 8A, there are four instances of each A portion 104A and four instances of each B portion 104B.

However, it is not required that a row contain only portions of the same type. FIG. 8B depicts a 4×2 array configuration with two A portions 104 and two B portions 104B in the top row. Likewise, there are two A portions 104A and two B portions 104B in the bottom row. Note that in this example, the A portion 104A is below another A portion 104A. However, as an alternative, the lower row of FIG. 8B could have the A portions 104A and the B portions 104B reversed.

It is not required that both the rows and the columns have an even number of portions, as depicted in FIGS. 8A and 8B. FIG. 8C depicts an example in which there are an odd number of columns but an even number of rows. Likewise, there could be an odd number of rows, but an even number of columns. Typically, there are not an odd number of portions in both the rows and the columns.

Referring to FIG. 8C, the first two rows have A portions 104A and the second two rows have B portions 104B. However, the A portions 104A could occupy the odd rows and the B portions 104B could occupy the even rows.

Triple Patterning Using a Single Reticle

Figure 9B:
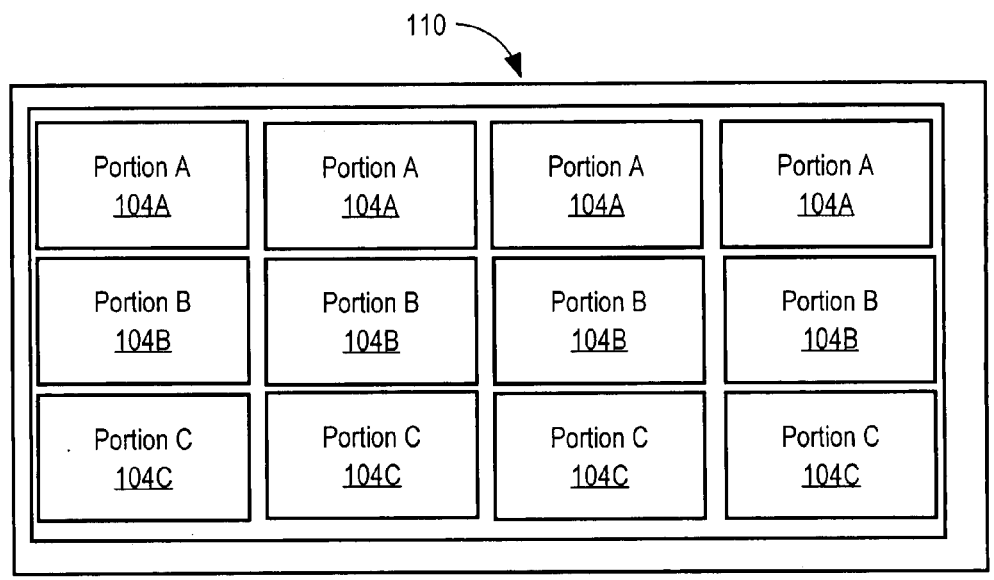
FIG. 9A and FIG. 9B illustrate two examples in which a reticle has three portions, in accordance with embodiments.
Figure 9A:
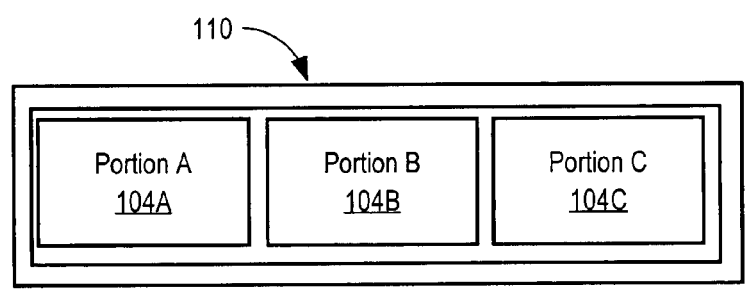

As previously mentioned the original pattern 102 may be split into three or more portions, wherein the reticle 110 includes each of the portions. FIG. 9A and FIG. 9B illustrate two examples in which a reticle 110 has three portions, in accordance with embodiments. In FIG. 9A, the three portions 104A, 104B, and 104C are in a 3×1 array. In the embodiment depicted in FIG. 9B, the portions 104A, 104B, 104C are in a 4×3 array with each row containing four similar portions (e.g., four instances of A portion 104A). Many other configurations could be used. Either the number of rows or the number of columns (or both) is an integer multiple of three for a reticle 110 to be used in triple patterning, in an embodiment.

Referring again to process 600 of FIG. 6, when using the example reticle 110 depicted in FIG. 9A, each of the three portions 104A, 104B, and 104C can be simultaneously exposed to a photoresist in block 604. After shifting of shot coordinates appropriately, the three portions 104A, 104B, and 104C are exposed again, as in block 610. For example, the A portion 104A is exposed where the B portion 104B previously was exposed and the B portion 104B is exposed where the C portion 104C previously was exposed. Then, the shot coordinates are shifted one additional time and the portions 104A, 104B, and 104C are exposed again such that the complete pattern of the interleaved features of portions 104A, 104B, and 104C can be transferred to the target region. Additional shots on the wafer can be made to cover target regions that have not yet been exposed to all three portions 104A, 104B, and 104C. In some cases, some target regions may not be exposed to all three portions, and hence may not be used.

The process 200 depicted in FIG. 2 can also be used for triple patterning. Further, the reticle 110 may have more than three unique portions. As such, process 200 and 600 may be used for greater than triple patterning.

Double Exposure-Single Etch

Figure 10A:
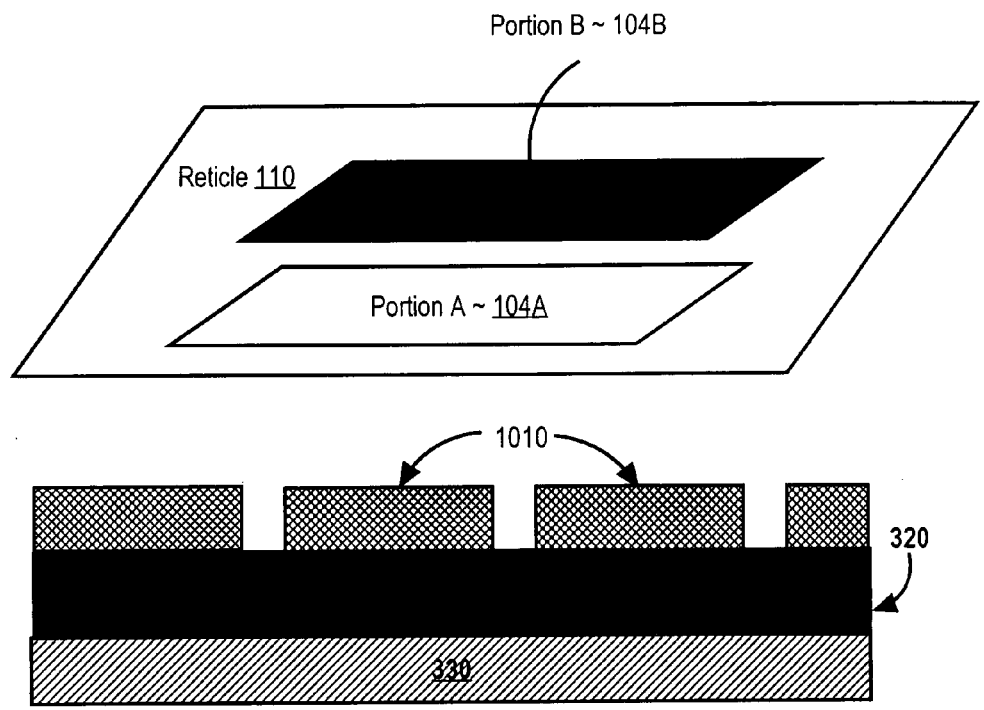
FIG. 10A and FIG. 10B illustrate a double patterning-single etch technique using a single reticle, in accordance with an embodiment.
Figure 10B:
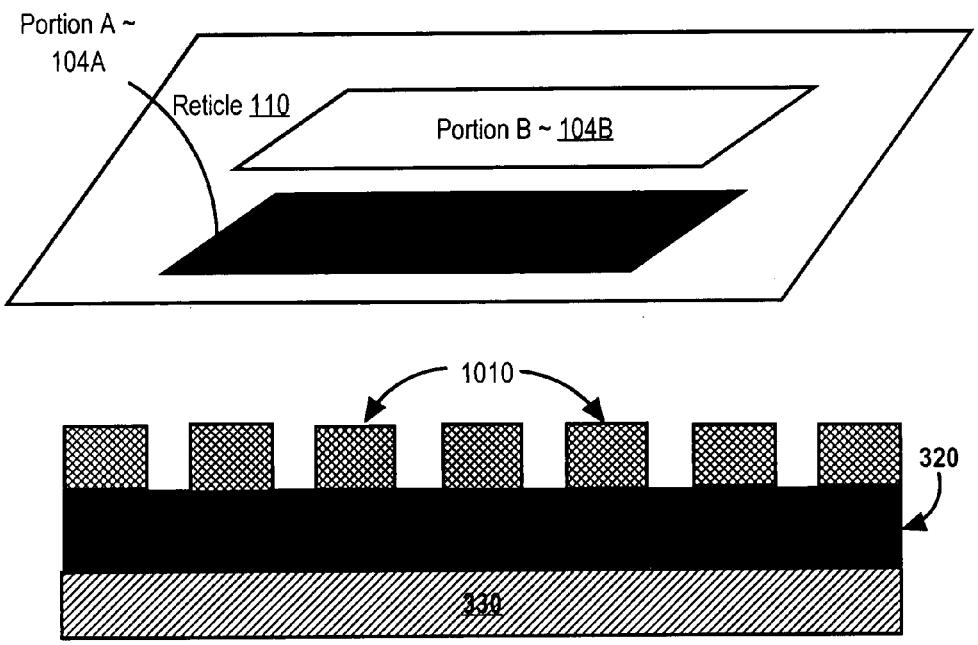

FIGS. 3A-3C and FIGS. 4A-4C depict an embodiment of double patterning by double exposure-double etch in which two photoresists 310, 410 are used. Only a single photoresist is used in a double exposure-single etch embodiment. Referring to FIG. 10A, first the A portion 104A is exposed to photoresist 1010. Prior to developing the photoresist 1010 and transferring the A portion 104A of the pattern from the photoresist 1010 to the hard mask 320, the B portion 104B of the pattern is exposed to the photoresist 1010, as depicted in FIG. 10B. Thus, the photoresist 1010 has the combined pattern having the features of the A portion 104A interleaved with the features of the B portion 104B. Then, the combined pattern is transferred to a hard mask 320 (results of this block not depicted in FIG. 10B). Finally, the combined pattern may be transferred to the wafer 330 (results of this block not depicted in FIG. 10B).

A double exposure-single etch technique can be used for any of the reticles 110 disclosed herein. Furthermore, process 200, in which a portion is bladed while the other is exposed, can be adapted to a double exposure-single etch technique. Furthermore, process 600 in which multiple portions are simultaneously exposed can be adapted to a double exposure-single etch technique.

Other Lithography Processes

While many examples herein have been directed to fabrication of a semiconductor wafers, the present invention is not so limited. Other examples of where double patterning using a single reticle can be applied include, but are not limited to, LCD panel lithography, lithography for a ceramic substrate, and lithography for a flexible substrate.

Extensions and Alternatives

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

Alternative embodiments of the invention are described throughout the foregoing specification, and in locations that best facilitate understanding the context of the embodiments. Furthermore, the invention has been described with reference to specific embodiments thereof. It will, however, be evident that various modifications and changes may be made thereto without departing from the broader spirit and scope of the invention.

In addition, in this description certain process acts are set forth in a particular order, and alphabetic and alphanumeric labels may be used to identify certain acts. Unless specifically stated in the description, embodiments of the invention are not necessarily limited to any particular order of carrying out such acts. In particular, the labels are used merely for convenient identification of acts, and are not intended to specify or require a particular order of carrying out such acts.

What is claimed is:

1. A double patterning method comprising:
    positioning a singular reticle in a lithographic apparatus, wherein the reticle has a first portion of a pattern and a second portion of the pattern, wherein interleaved features of the pattern are separated into the first and second portions and wherein the first portion and the second portion are within a scribe line of the reticle, wherein the interleaved features of the pattern require that for at least some pairs of adjacent features of the first portion there is at least one feature of the second portion located therebetween;
    exposing the first portion of the pattern onto a first photoresist that overlays a target region of a material to be patterned;
    transferring the first portion of the pattern from the first photoresist to the target region of the material;
    exposing the second portion of the pattern onto a second photoresist that overlays the target region of the material;
    transferring the second portion of the pattern from the second photoresist to the target region, wherein features of the second portion are interleaved in the target region with features of the first portion to form the pattern;
    wherein exposing the first portion and exposing the second portion is performed simultaneously while the reticle remains positioned in the lithographic apparatus;
    wherein the reticle includes a third portion of the pattern, the interleaved features of the pattern being separated into the first, second, and third portions and wherein the first portion, second, and third portions are distinct portions.

2. The method of claim 1, further comprising preventing the second portion from being exposed onto the first photoresist while performing exposing the first portion of the pattern onto the first photoresist.

3. The method of claim 2, further comprising preventing the first portion from being exposed onto the second photoresist while performing exposing the second portion of the pattern.

4. The method of claim 1, wherein the target region is a first target region, and further comprising:
    after exposing the first portion of the pattern onto a portion of the first photoresist that overlays the first target region and prior to exposing the second portion of the pattern onto a portion of the second photoresist that overlays the first target region, changing shot coordinates of the reticle in order to cause the second portion to be aligned to expose the second portion to the portion of the second photoresist that overlays the first target region.

5. The method of claim 1, wherein the reticle comprises a plurality of first portions of the pattern and a plurality of second portions of the pattern, wherein the first and second portions comprise an array.

6. The method of claim 1, wherein the reticle further has a third portion of the pattern, and wherein interleaved features of the pattern are separated into the first, the second, and the third portions; and further comprising:
    exposing the third portion of the pattern onto a third photoresist that overlays the target region; and
    transferring the third portion of the pattern from the third photoresist to the target region, wherein features of the first portion, the second portion, and the third portion are interleaved in the target region to form the pattern.

7. The method of claim 1, further comprising keeping the reticle in the lithographic apparatus between the exposing the first portion of the pattern onto the first photoresist and the exposing the second portion of the pattern onto the second photoresist.

8. The method of claim 1, further comprising:
    exposing multiple instances of the first portion of the pattern onto the first photoresist while concurrently exposing multiple instances of the second portion of the pattern onto the second photoresist, wherein each instance of the first portion is exposed over a portion of the first photoresist that overlays a different target region of the material; and
    wherein each instance of the second portion is exposed over a different portion of the second photoresist that overlays one of the different target regions of the material.

9. The method of claim 1, wherein the first portion and the second portion enclosed within a scribe line of the reticle are not separated by a scribe line.

10. The method of claim 1, wherein the reticle includes a third portion of the pattern, the interleaved features of the pattern being separated into the first, second, and third portions and wherein the first portion, second, and third portions are within a scribe line of the reticle.

11. A double patterning method comprising:
    positioning a singular reticle in a lithographic apparatus, wherein the reticle has at least two portions of a pattern with interleaved features and wherein the at least two portions are within a scribe line of the reticle;
    controlling exposure of the at least two portions of the pattern simultaneously onto a photoresist that overlays both a first and a second target regions of a material to be patterned while the reticle remains positioned in the lithographic apparatus; and
    transferring the pattern to the first and second target regions of the material;
    wherein the reticle includes a third portion of the pattern, the interleaved features of the pattern being separated into the first, second, and third portions and wherein the first portion, second, and third portions are distinct portions.

12. The method of claim 11, wherein controlling exposure further comprises:
    exposing a second portion of the pattern onto a portion of the photoresist that overlays a second target region of the material while exposing a first portion of the pattern onto the portion of the photoresist that overlays the first target region.

13. The method of claim 11, wherein controlling exposure further comprises:
    after exposing a first portion of the pattern to a portion of the photoresist that overlays the first target region and prior to exposing the second portion of the pattern to the portion of the photoresist that overlays the first target region, changing shot coordinates of the reticle in order to cause the second portion of the pattern to be aligned to expose the second portion to the portion of the photoresist that overlays the first target region.

14. The method of claim 11, wherein the at least two portions are provided in an array pattern on the reticle.

15. The method of claim 11, wherein controlling exposure further comprises:
    exposing multiple instances of a first portion of the pattern onto the photoresist,
    wherein each instance of the first portion is exposed over a portion of the photoresist that overlays a different target region of the material; and exposing multiple instances of a second portion of the pattern onto the photoresist, wherein each instance of the second portion is exposed over one of the portions of the photoresist that overlays a different target region, wherein features of each instance of the first portion are interleaved with features of one of the instances of the second portion in the photoresist to form the pattern.

16. The method of claim 11, wherein the interleaved features of the pattern require that for at least some pairs of adjacent features of the first portion there is at least one feature of the second portion located therebetween.

17. The method of claim 11, wherein the first portion and the second portion enclosed within a scribe line of the reticle are not separated by a scribe line.

18. The method of claim 11, wherein the reticle includes a third portion of the pattern, the interleaved features of the pattern being separated into the first, second, and third portions and wherein the first portion, second, and third portions are within a scribe line of the reticle.

19. A double patterning method comprising:
    positioning a singular reticle in a lithographic apparatus, wherein the reticle has a first portion of a pattern and a second portion of the pattern, wherein interleaved features of the pattern are separated into the first and second portions;
    exposing the first portion of the pattern onto a first photoresist that overlays a first target region of a material to be patterned;
    transferring the first portion of the pattern from the first photoresist to the first target region of the material;
    exposing the second portion of the pattern onto a second photoresist that overlays the first target region of the material;
    transferring the second portion of the pattern from the second photoresist to the first target region, wherein features of the second portion are interleaved in the target region with features of the first portion to form the pattern;
    exposing the second portion of the pattern onto the first photoresist that overlays a second target region of the material to be patterned while performing exposing the first portion of the pattern onto the first photoresist that overlays the first target region; and
    wherein exposing the first portion and exposing the second portion is performed simultaneously while the reticle remains positioned in the lithographic apparatus;
    wherein the reticle includes a third portion of the pattern, the interleaved features of the pattern being separated into the first, second, and third portions and wherein the first portion, second, and third portions are distinct portions.

20. The method of claim 19, wherein the interleaved features of the pattern require that for at least some pairs of adjacent features of the first portion there is at least one feature of the second portion located therebetween.

21. The method of claim 19, wherein the first portion and the second portion enclosed within a scribe line of the reticle are not separated by a scribe line.

22. The method of claim 19, wherein the reticle includes a third portion of the pattern, the interleaved features of the pattern being separated into the first, second, and third portions and wherein the first portion, second, and third portions are within a scribe line of the reticle.

* * * * *